(12) United States Patent
Chen et al.

(10) Patent No.: US 8,883,403 B2
(45) Date of Patent: Nov. 11, 2014

(54) METHOD OF SEMICONDUCTOR INTEGRATED CIRCUIT FABRICATION

(75) Inventors: Chun-Chang Chen, Tainan (TW); Shun-Shing Yang, Tainan (TW); Chuan-Ling Wu, Yuanlin Township (TW); Wang-Pen Mo, Pingtung (TW); Hung-Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

(21) Appl. No.: 13/616,802

(22) Filed: Sep. 14, 2012

(65) Prior Publication Data
US 2014/0080067 A1  Mar. 20, 2014

(51) Int. Cl.
*G03F 7/26* (2006.01)

(52) U.S. Cl.
USPC .......................................... 430/313; 430/315

(58) Field of Classification Search
CPC ....... G03F 7/094; G03F 7/0035; G03F 7/165; G03F 7/095; G03F 7/703; G03F 7/093; H01L 21/0276; H01L 21/32139; H01L 23/5226
USPC .......................................... 430/325, 311, 313
See application file for complete search history.

(56) References Cited

U.S. PATENT DOCUMENTS 5,770,350 A * 6/1998 Lee ................................ 430/325
6,100,158 A * 8/2000 Lee et al. ...................... 438/401

* cited by examiner

*Primary Examiner* — Caleen Sullivan
(74) *Attorney, Agent, or Firm* — Haynes and Boone, LLP

(57) ABSTRACT

A method of fabricating a semiconductor integrated circuit (IC) is disclosed. The method includes providing a substrate having two different topography areas adjacent to each other. A step-forming material (SFM) is deposited over the substrate. A patterned SFM is formed in the low topography area of the two areas. The formation of the patterned SFM provides a fairly planar surface across over the substrate.

20 Claims, 6 Drawing Sheets

US 8,883,403 B2

METHOD OF SEMICONDUCTOR INTEGRATED CIRCUIT FABRICATION

BACKGROUND

The semiconductor integrated circuit (IC) industry has experienced exponential growth. Technological advances in IC design and material have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. For example, in lithography process, a control of photoresist thickness uniformity plays an important role in controlling uniformity of critical dimensions (CD). Challenges arise when topography varies substantially across the substrate where a lithography patterning is to be performed. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
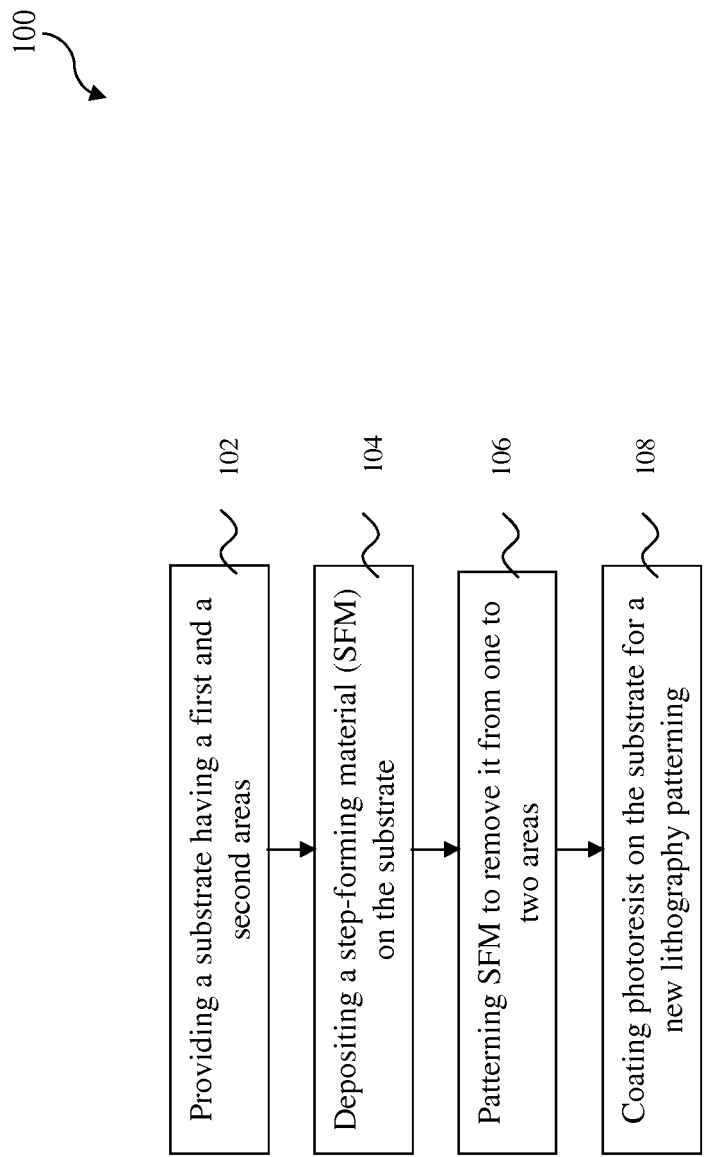
FIG. 1 is a flowchart of an example method for fabricating a semiconductor integrated circuit (IC) according to various aspects of the present disclosure.

FIG. 1 is a flowchart of one embodiment of a method 100 of fabricating one or more semiconductor integrated circuits (ICs) according to aspects of the present disclosure. The method 100 is discussed in detail below, with reference to a semiconductor IC device 200 shown in FIGS. 2 through 6 for the sake of example.

The method 100 begins at step 102 by providing a substrate 210. The substrate 210 may include silicon, germanium, silicon germanium, gallium arsenide or other appropriate semiconductor materials. Alternatively, the substrate 210 may include an epitaxial layer. Further, the substrate 210 may be strained for performance enhancement. Furthermore, the substrate 210 may include a semiconductor-on-insulator (SOI) structure such as a buried dielectric layer. Also, the substrate 210 may include a buried dielectric layer such as a buried oxide (BOX) layer, such as that formed by a method referred to as separation by implantation of oxygen (SIMOX) technology, wafer bonding, SEG, or other appropriate methods. The substrate 210 may also include a fin structure of a fin-like field-effect transistor (FinFET) formed by suitable processes, such as lithography patterning process and etching process. The substrate 210 may also include structures of a microelectro mechanical system (MEMS) device. In fact, various embodiments may include any of a variety of substrate structure and materials.

The substrate 210 may also include various doped regions (not shown) formed by implantation techniques. For example, a portion of the substrate 210 is doped to form a P-type region and a P-well where an n-channel device will be fabricated. Similarly, another portion of the substrate 210 is doped to form an N-type region and an N-well where a p-channel device will be fabricated. The doped regions are doped with P-type dopants, such as boron or $BF_2$, and/or N-type dopants, such as phosphorus or arsenic. The doped regions may be formed directly on the substrate 210, in a P-well structure, in an N-well structure, in a dual-well structure, or using a raised structure.

The substrate 210 may also includes various isolation features, such as shallow trench isolation (STI), formed in the substrate 210 to separate various devices. The formation of the STI may include etching a trench in the substrate 210, filling the trench by dielectric materials such as silicon oxide, silicon nitride, or silicon oxynitride and using chemical mechanical polishing (CMP) to remove the excess dielectric material layers.

Figure 2:
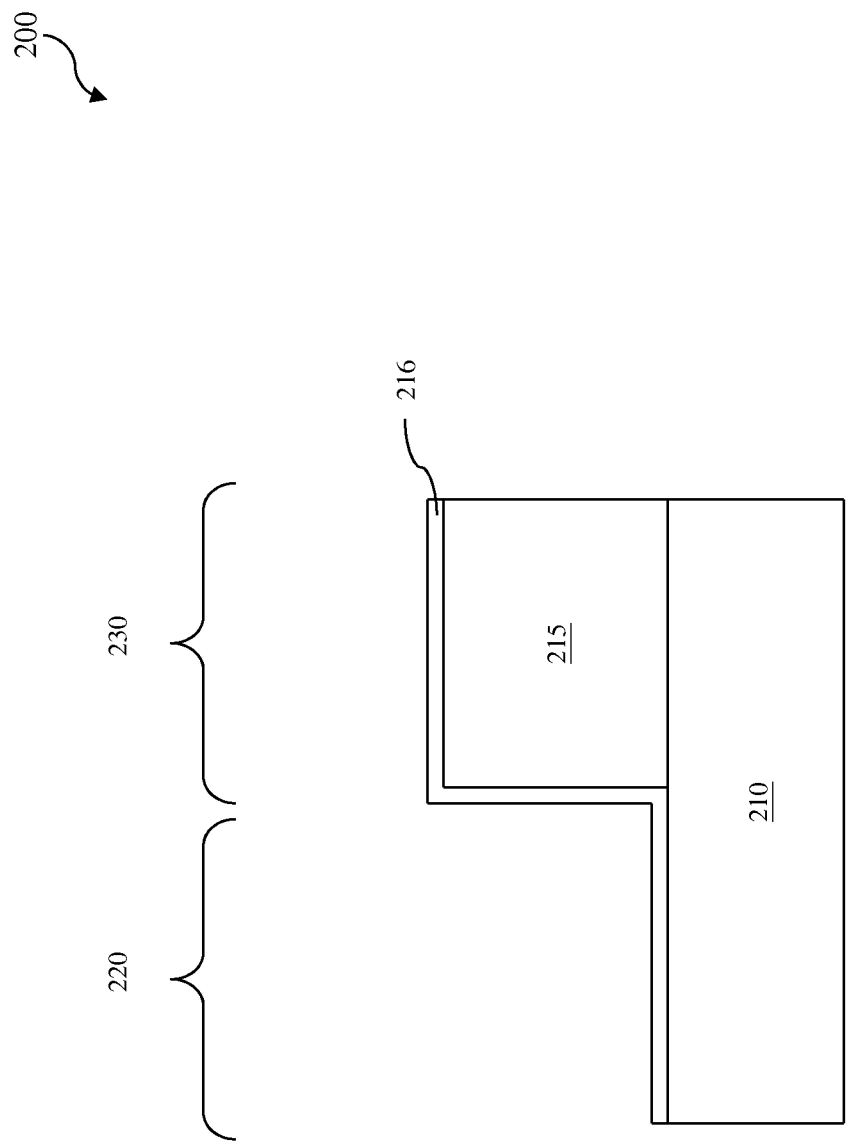
FIGS. 2 through 6 are cross-sectional views of an example semiconductor integrated circuit (IC) at fabrication stages constructed according to the method of FIG. 1.

In the present embodiment, the substrate 210 includes a first area 220 and a second area 230, as shown in FIG. 2. The first area 220 is adjacent to the second area 230. A top surface of the second area 230 is substantially higher than a top surface of the first area 220. As an example, a height difference between the top surfaces of the areas 220 and 230 is about 1500 Å to about 3500 Å. In one embodiment, the second area 230 includes a high-step-feature (HSF) 215. The HSF 215 may include a single layer or multiple layers. The various layers of the HSF 215 may combine to form a device or feature of the semiconductor IC device 200. The HSF 215 may include a polysilicon feature of a flash device, a gate feature in a FinFET, a raised chamber structure of a MEMS device, or any other features.

Referring also to FIG. 2, in one embodiment, a hard mask 216 is deposited over the substrate 210. The hard mask 216 may include silicon nitride, silicon oxide, silicon oxynitride, silicon carbide, silicon-oxide-carbide, or other suitable hard mask materials. The hard mask 216 may be deposited by chemical vapor deposition (CVD). The hard mask 216 serves as a protection layer to protect underlying layers in a subsequent etching process.

Figure 3:
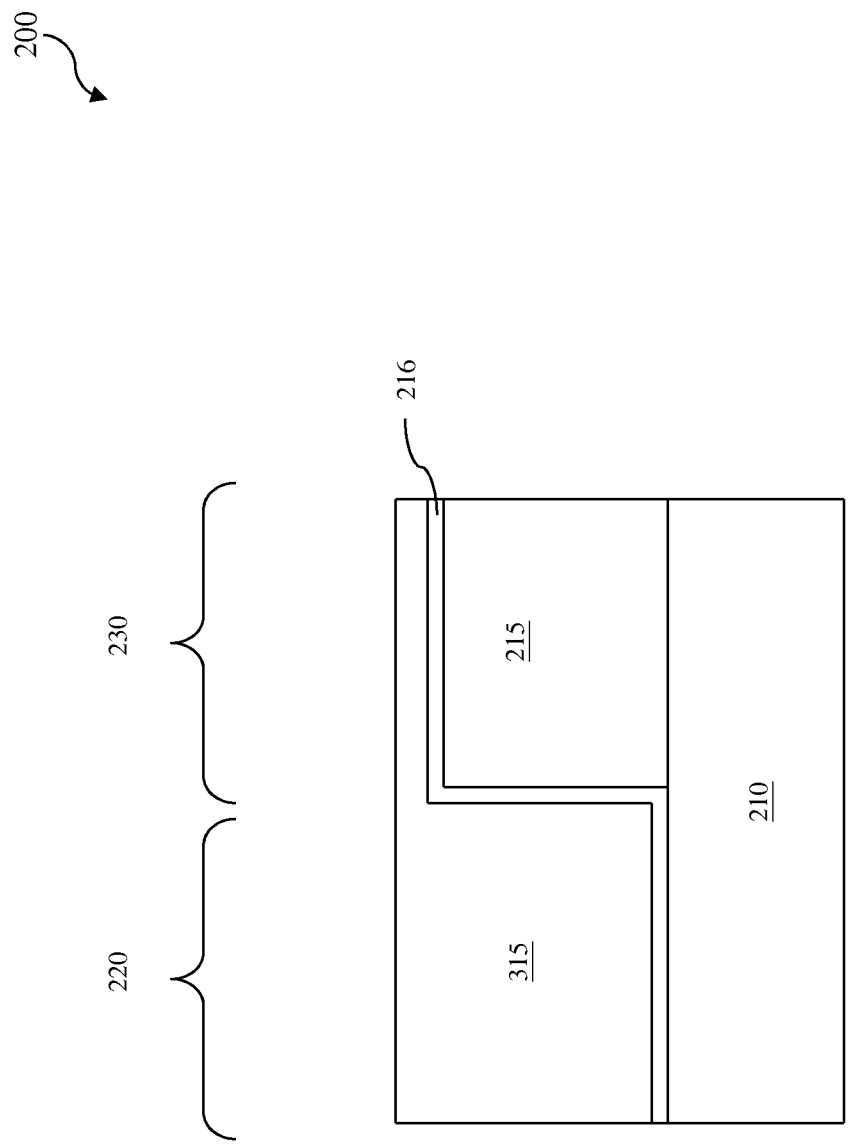

The method 100 proceeds to step 104 by depositing a step-forming material (SFM) 315 over substrate 210 in the areas 220 and 230. The SFM 315 is deposited such that it has a relatively thin coverage on the top surface of the second area 230 and a relatively thick coverage on the top surface of the area 220. Thus, the top surfaces across the first and second areas are substantially planar, as shown in FIG. 3.

In the present embodiment, the SFM 315 includes a photosensitive material (referred to as a photosensitive SFM) deposited by a spin-coat process. The photosensitive material is configured such that when it is exposed to light, chemical reactions happen in exposed regions of the photosensitive material, which increase or decrease solubility of the exposed regions. If the exposed regions become more soluble, the photosensitive material is referred to as a positive photoresist. If the exposed regions become less soluble, the photosensitive material is referred to as a negative photoresist. In the present example, the SFM 315 includes a negative photoresist material. Alternatively, the SFM 315 includes a positive photoresist material.

Additionally, a dehydration process may be performed before applying the SFM 315 on the substrate 210, which can enhance an adhesion of the SFM 315 to the substrate 210. The dehydration process may include baking the substrate 210 at a high temperature for duration of time, or applying a chemical such as hexamethyldisilizane (HMDS) to the substrate 210. Alternatively, a soft bake (SB) may be applied, which may increase a mechanical strength of the SFM 315.

The SFM 315 may also include any other appropriate materials, such as spin-on-glass (SOG) and dielectric materials deposited by any suitable method, such as spin-on coating, atomic layer deposition (ALD), CVD, and ozone oxidation. The SFM 315 may also include a polymer that turns soluble to a base solution in response to reaction with acid.

Figure 4:
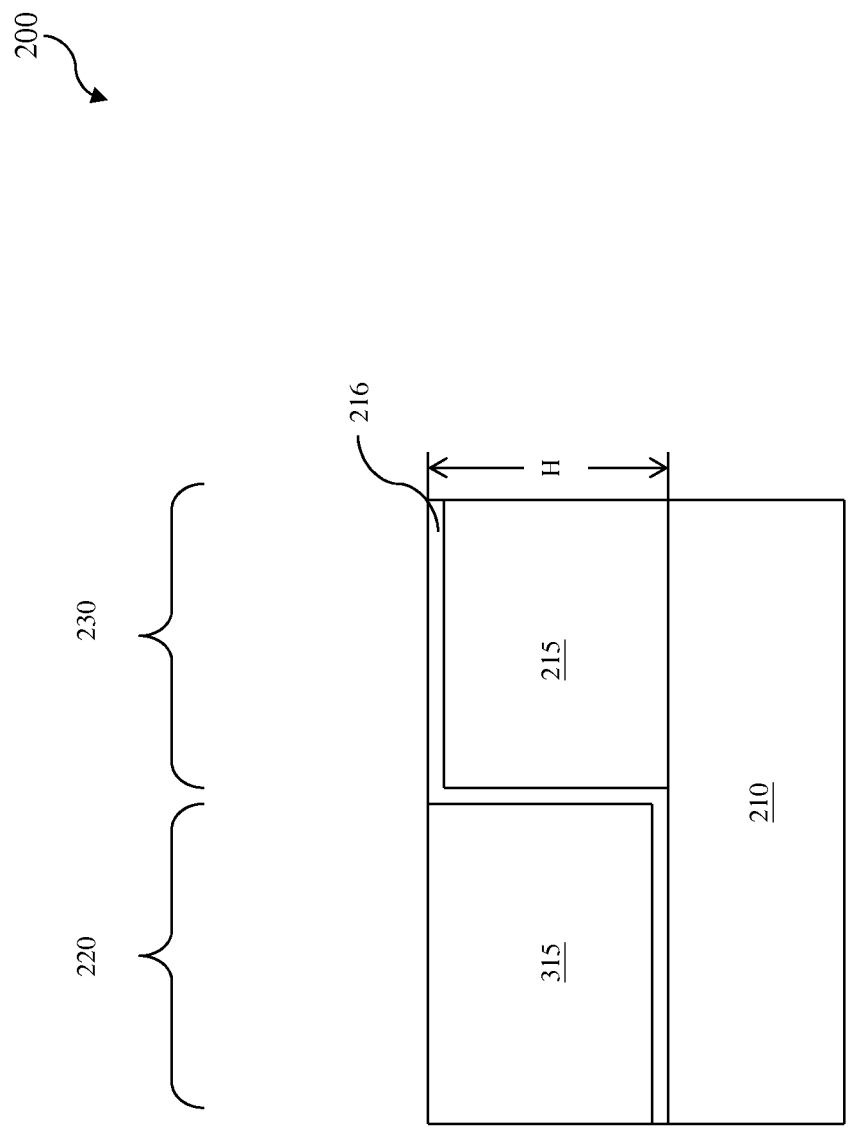

The method 100 proceeds to step 106 by forming a patterned SFM 315 such that it remains in the area 220 and is removed from the area 230, as shown in FIG. 4. Thus, the top surface of the area 220 is substantially planar with the top surface of the area 230. As an example, a height difference between top surfaces of the area 220 and area 230 is less than 5% of the total height (H) of the area 230.

In the present embodiment, a patterning process is performed by exposing the SFM 315 through a photomask using an exposing tool to form an image pattern on the SFM 315, such that a developing process can remove the SFM 315 from area 230 while the SFM 315 remains in the area 220. The exposing tool may include an optical exposing tool, such as I-line (365 nm), deep ultraviolet (DUV), extreme ultraviolet (EUV), or X-ray exposing tool, or a charged particle tool such as an electron beam writer. The photomask blocks some portions of the light and passes some portions of the light. When the light projects on the SFM 315, it reacts with a photo sensitive chemical in the SFM 315 to form a latent image. For example, the photo sensitive chemical is a photo acid generator (PAG) in the SFM 315. The PAG in the resist releases acid under the radiation of the light, and the acid promotes a chemical amplify reaction (CAR), for example, releasing a protection group from the resist in an exposed area during a PEB process. Because of releasing the protection group from the resist, a polarity of the resist in the exposed areas changes from hydrophobic polarity to hydrophilic polarity and a latent pattern is also formed in the exposed SFM 315.

A developing solution may be utilized to remove portions of the SFM 315. The developing solution may remove the exposed or unexposed portions depending on the type of photosensitive material of the SFM 315. If the SFM 315 includes a negative-type resist, the exposed portions in the area 220 are not dissolved by the developing solution and remain in the area 220 while the non-exposed portions in the area 230 are dissolved. If the SFM 315 includes a positive-type resist, the exposed portions in the area 230 are dissolved by a positive-tone developing solution while leaving the unexposed portions of the area 220 behind. Additionally a post expose bake (PEB), a post develop bake (PDB), or both may be applied.

In another embodiment, the SFM 315 is patterned by lithography and etching back processes such that the SFM 315 is removed from the area 230 yet remains in the area 220. In yet another embodiment, a CMP is performed to remove the SFM 315 in the area 230.

Figure 5:
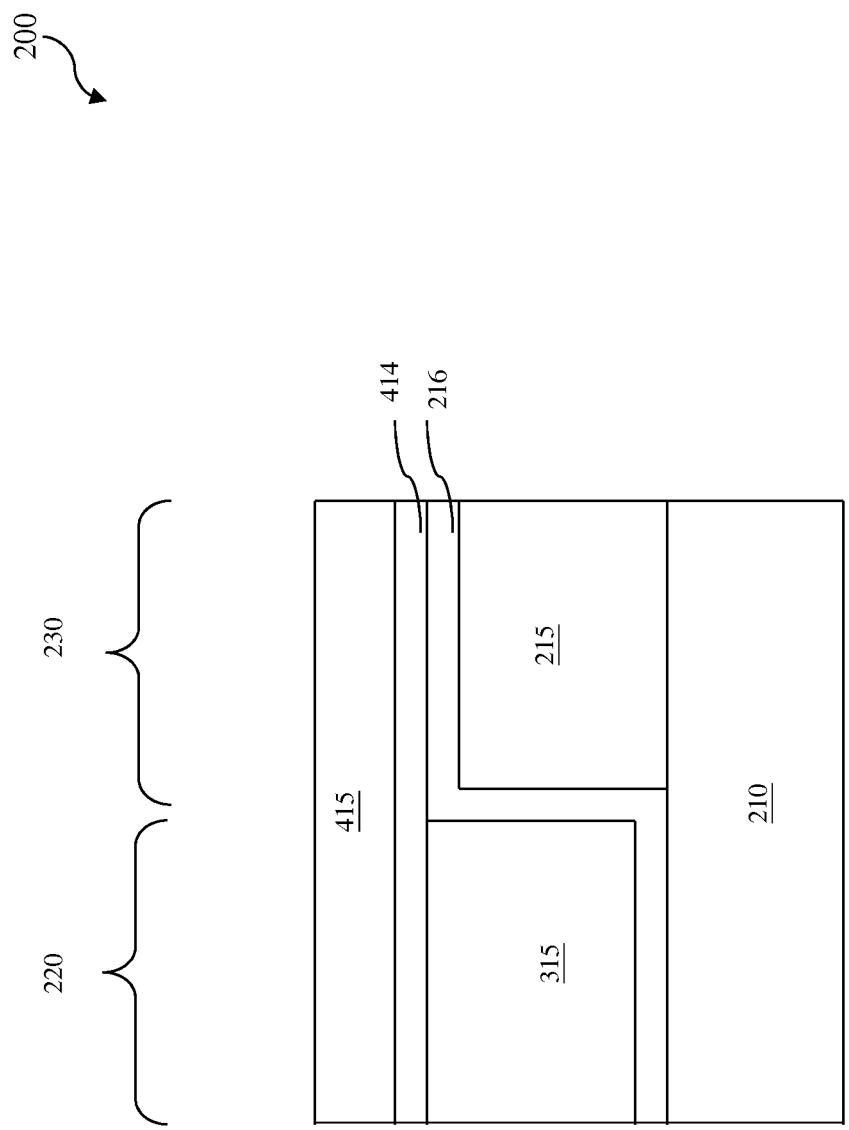

The method 100 proceeds to step 108 by performing a lithography patterning process to form a patterned photoresist over the substantially planar surface of the areas 220 and 230 on the substrate 210. Generally, a lithography patterning process may include photoresist coating (e.g., spin-on coating), photoresist soft baking, mask aligning, photolithography exposing, photo resist post-exposure baking, photoresist developing and rinsing, other suitable processes, or combinations thereof. In FIG. 5, a photoresist 415 is coated on the substrate 210. The photoresist 415 includes a different type of photosensitive material than the SFM 315. For example, in the depicted embodiment, where the SFM 315 includes a negative photosensitive material, the photoresist 415 includes a positive photosensitive material.

A bottom anti-reflective coating (BARC) layer 414 may be deposited underlying the photoresist 415 to provide anti-reflection during a subsequent patterning process, as shown in FIG. 5. The BARC layer 414 may include polymer material or resist material. For example, the material layer may be one of t-Butyloxycarbonyl (t-BOC) resist, acetal resist, and environmentally stabilized chemically amplified photoresist (ES-CAP). As another example, the BARC layer 414 is made of polymeric material being cross-linked. As yet anther example, the polymeric material can be spin-on coated and then cross-linked using a baking process with temperature ranging between about 90° C. and 300° C. Alternatively, this temperature range could be about 100° C. to 180° C. Alternatively, the polymeric material may not be cross-linked, and in that case, the BARC layer 414 may use a solvent that is not capable of dissolving the photoresist 415 formed above the BARC layer 414. For example, the BARC layer 414 may use butanol as a solvent. The BARC layer 414 may also include dielectric materials such as silicon oxide, silicon nitride, or silicon oxynitride.

With the patterned SFM 315, the original elevational disparity between areas 220 and 230 is substantially reduced, such that thickness uniformity of the photoresist 415 (as well as the BARC layer 414) across areas 220 and 230, particularly at the junction of the area 220 and the area 230, is substantially improved.

The photoresist 415 may then be exposed by a lithography exposure tool, such as a scanner operable in a step and scan operation for exposure. In one embodiment of the exposing process, the photoresist 415 is exposed to a radiation energy such as deep ultra-violet (DUV) or extreme ultra-violet (EUV) through a photomask (mask or reticle) having an integrated circuit pattern predefined according to a design layout, resulting in a resist pattern that includes a plurality of exposed regions and a plurality of unexposed regions. In various examples for illustration, the radiation energy may include a 248 nm beam by Krypton Fluoride (KrF) excimer lasers or a 193 nm beam by Argon Fluoride (ArF) excimer lasers. In other examples, the radiation energy may include EUV with a wavelength of about 13.5 nm or less.

Figure 6:
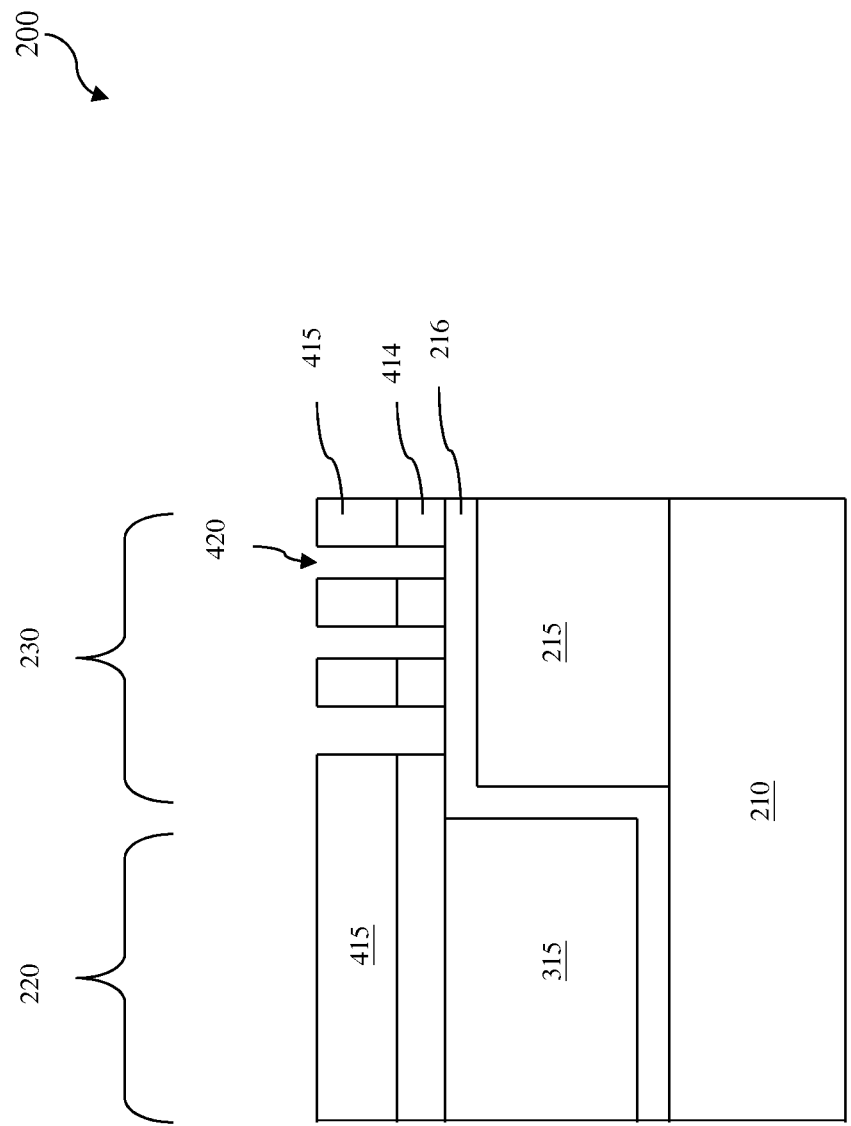

In one embodiment, the photoresist 415 is a positive photosensitive material. Through the interaction between the PAG in the photoresist 415 and the radiation energy, an acid is generated in the exposed region of the photoresist 415. Then a developing solution (developer) is applied to the photoresist 415 to develop the exposed photosensitive layer 415 and form openings 420, as shown in FIG. 6.

The method 100 may further include removing a portion of the HSF 215 through the opening 420 by an etching process. Additional steps can be provided before, during, and after the method 100, and some of the steps described can be replaced, eliminated, or moved around for additional embodiments of the method 100.

Based on the above, the present disclosure offers a method of IC fabrication with a scheme of forming a patterned SFM in a high topography variation substrate. By incorporating the patterned SFM, elevational disparity of the substrate is minimized, thereby providing a substantially planar surface. It significantly improves thickness uniformity of photoresist across the substrate, where it originally has substantial different height topography. The method provides a fairly simple process to solve high topography issues and is adopted easily in an existing process flows. It may relax patterning constrain and complexity and achieves a better CD uniformity control.

The present disclosure provides many different embodiments of fabricating a semiconductor IC that provide one or more improvements over the prior art. In one embodiment, a method for fabricating a semiconductor integrated circuit (IC) includes providing a substrate having a first area and a second area. The method also includes depositing a photosensitive step-forming-material (SFM) over the first and the second areas and forming a patterned photosensitive SFM in the first area.

In another embodiment, a semiconductor IC fabricated by the method of the present disclosure includes providing a substrate having a low topography first area adjacent to a high topography second area. The method also includes forming a hard mask layer in the first and the second areas on the substrate, forming a step-forming-material (SFM) over the hard mask in the first and the second areas, removing the SFM from the second area to form a patterned SFM in the first area, forming a photoresist over the patterned SFM in the first area and the second area and patterning the photoresist.

In another embodiment, a method for fabricating a semiconductor integrated circuit (IC) includes providing a substrate having a low topography first area adjacent to a high topography second area. The method also includes depositing a hard mask layer on the first and second area on the substrate, depositing a step-forming-material (SFM) over the hard mask to form a substantially planar surface, forming a patterned SFM in the first area with a substantially planar surface with the second area, depositing a bottom anti-reflective coating (BARC) layer in the first and the second area, coating a photoresist over the BARC layer and patterning the photoresist by lithography process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
   providing a substrate having a first area and a second area, wherein a top surface of the first area is in a different plane than a top surface of the second area;
   depositing a photosensitive step-forming-material (SFM) over the first and second areas; and
   removing the SFM from the second area, thereby forming a patterned photosensitive SFM in the first area;
   wherein the height difference between top surfaces of the first area and the second area is about 1500 Å to about 3500 Å.

2. The method of claim 1, wherein before forming the patterned photosensitive SFM, the top surface of the first area is substantially lower than the top surface of the second area.

3. The method of claim 1, wherein the photosensitive SFM is patterned by a lithography process.

4. The method of claim 3, wherein the photosensitive SFM in the second area is removed during the lithography process.

5. The method of claim 3, wherein the lithography process includes:
   spin-on coating the photosensitive SFM on the substrate in the first and second areas;
   exposing the photosensitive SFM by a radiation energy through a photo mask; and
   developing the exposed photosensitive SFM to retain the photosensitive SFM in the first area and remove the photosensitive SFM from the second area.

6. The method of claim 1, wherein the formation of the patterned SFM makes the top surface of the first area substantially planar to the top surface of the second area.

7. The method of claim 6, wherein a height difference between the top surfaces of the first area and the second area is less than 5% of a total height of the second area.

8. The method of claim 1, further comprising:
   after forming the patterned photosensitive SFM, coating a photoresist on the first and second areas of substrate; and
   performing a lithography patterning process on the photoresist.

9. The method of claim 8, wherein the photoresist is a different type of photosensitive material than the photosensitive SFM.

10. The method of claim 1, wherein the SFM over the first area is substantially coplanar with the SFM over the second area.

11. A method for fabricating a semiconductor integrated circuit (IC), the method comprising:
   providing a substrate having a low topography first area adjacent to a high topography second area;
   forming a hard mask layer over the substrate in the first area and the second area;
   forming a step-forming-material (SFM) over the hard mask layer in the first area and the second area such that the SFM over the first area is substantially coplanar with the SFM over the second area;
   removing the SFM from the second area to expose a top surface of the hard mask layer in the second area such that the top surface of the hard mask layer in the second area is substantially planar with a top surface of the SFM over the first area;
   after removing the SFM from the second area, forming a photoresist over the substrate in the first area and the second area; and
   patterning the photoresist.

12. The method of claim 11, wherein the SFM includes a photosensitive material.

13. The method of claim 12, wherein the photosensitive material of the SFM is different than a photosensitive material of the photoresist.

14. The method of claim 11, wherein the SFM includes a negative type resist material and the photoresist includes a positive type resist material.

15. The method of claim 11, wherein the SFM is removed from the second area by a lithography patterning and etching process such that the SFM remains in the first area.

16. The method of claim 11, wherein the SFM is removed from the second area by a chemical mechanical polishing (CMP).

17. The method of claim 11, wherein providing the substrate having the low topography first area adjacent to the high topography second area includes the low topography first area and the high topography second area each having a top surface and wherein the height difference between the top surfaces of the low topography first area and the high topography second area is about 1500 Å to about 3500 Å.

18. A method for fabricating a semiconductor integrated circuit (IC), the method comprising:
    providing a substrate having a low topography first area adjacent to a high topography second area;
    forming a hard mask layer in the first and second area on the substrate;
    depositing a step-forming-material (SFM) over the hard mask;
    forming a patterned SFM in the first area such that a top surface of the patterned SFM is substantially planar to a top surface of the hard mask layer over the second area;
    depositing a bottom anti-reflective coating (BARC) layer in the first and the second area;
    depositing a photoresist over the BARC layer; and
    patterning the photoresist by a lithography process.

19. The method of claim 18, wherein the SFM includes a photosensitive SFM such that it is a different type of photosensitive materials than the photoresist.

20. The method of claim 18, wherein providing the substrate having the low topography first area adjacent to the high topography second area includes the low topography first area and the high topography second area each having a top surface and wherein the height difference between the top surfaces of the low topography first area and the high topography second area is about 1500 Å to about 3500 Å.

* * * * *